United States Patent
Li et al.

(10) Patent No.: US 11,394,234 B2
(45) Date of Patent: Jul. 19, 2022

(54) MULTI POWER SOURCE SYSTEMS FOR PHOTOVOLTAIC BATTERY CONTROL

(71) Applicant: NEXTracker Inc., Fremont, CA (US)

(72) Inventors: Chen Li, Fremont, CA (US); Yang Liu, Mountain View, CA (US)

(73) Assignee: NEXTRACKER LLC, Fremont, CA (US)

( * ) Notice: Subject to any disclaimer, the term of this patent is extended or adjusted under 35 U.S.C. 154(b) by 662 days.

(21) Appl. No.: 16/364,959

(22) Filed: Mar. 26, 2019

(65) Prior Publication Data
US 2019/0305163 A1    Oct. 3, 2019

(51) Int. Cl.
*H02J 7/35* (2006.01)
*H01L 31/053* (2014.01)
*H02S 10/20* (2014.01)

(52) U.S. Cl.
CPC .............. *H02J 7/35* (2013.01); *H01L 31/053* (2014.12); *H02S 10/20* (2014.12)

(58) Field of Classification Search
CPC .......................................................... H02J 7/35
USPC ......................................................... 320/101
See application file for complete search history.

(56) References Cited

U.S. PATENT DOCUMENTS

| 5,796,274 | A | 8/1998 | Willis et al. |
| 2004/0089337 | A1 | 5/2004 | Chou |
| 2005/0284468 | A1 | 12/2005 | Pawlenko et al. |
| 2007/0007825 | A1 | 1/2007 | Heber et al. |
| 2007/0297058 | A1* | 12/2007 | Briee .................... E04D 13/033 359/597 |
| 2009/0174388 | A1 | 7/2009 | Kung et al. |
| 2012/0139471 | A1* | 6/2012 | Dubovsky ................. H02J 7/35 320/101 |
| 2015/0270731 | A1 | 9/2015 | Adelmann et al. |
| 2017/0093329 | A1* | 3/2017 | Jensen .................. F24S 30/425 |

FOREIGN PATENT DOCUMENTS

CN    203562977 U    4/2014

OTHER PUBLICATIONS

Notice of Acceptance issued in Australian Patent Application No. 2019248465 dated Sep. 22, 2021, 4 pages.
First Office Action issued in Chinese Patent Application No. 201810282832.5 dated Nov. 5, 2020 with English translation.
The Second Office Action issued in Chinese Patent Application No. 201810282832.5 dated Jul. 5, 2021 with English translation.
(Continued)

*Primary Examiner* — Jerry D Robbins
(74) *Attorney, Agent, or Firm* — Weber Rosselli & Cannon LLP

(57) ABSTRACT

A multi-power source system including a first power source, a second power source in a parallel with the first power source, and a diode preventing power from the second power source to drive the first power source but permitting the first power source to charge the second power source. The system also includes a controller operably coupled to both the first and second power sources, and a plurality of field effect transistor (FETs) arranged in series with one or more of the first power source, the second power source, and the load, wherein controller can switch the plurality of FETs to enable the first power source to drive the load or the second power source to drive the load.

20 Claims, 6 Drawing Sheets

(56) References Cited

OTHER PUBLICATIONS

Examination Report No. 1 issued in Australian Patent Application No. 2019248465 dated Mar. 17, 2021, 4 pages.
Notification of Transmittal of the International Search Report and The Written Opinion of the International Searching Authority, or the Declaration issued in corresponding PCT Application No. PCT/US19/24098 dated Jun. 19, 2019, 8 pages.
Extended European Search Report issued in European Patent Application No. 19781235.7-1202 dated Jan. 5, 2022, 9 pages.
First Examination Report issued in Indian Patent Application No. 202017041663 dated Dec. 2, 2021, 7 pages. With English translation.

* cited by examiner

MULTI POWER SOURCE SYSTEMS FOR PHOTOVOLTAIC BATTERY CONTROL

TECHNICAL FIELD

The present disclosure relates to dual power systems and control algorithms for determining which to apply to a load. More particularly, the present disclosure is directed to solar systems, and more particularly self-powered solar tracking systems and the control systems and algorithms for switching between solar power and battery power to drive the solar trackers.

BACKGROUND

There have been developed a number of solutions power source control in dual and multi-source power systems. In the solar tracker scenario, and particularly the self-powered solar tracker scenario, as described in commonly owned U.S. Patent Publication No. 2016/0308488 filed Dec. 15, 2016, and entitled Self Powered Solar Tracker Apparatus, there have been developed certain control systems. One of these control systems determines the source of the power to be applied to a drive motor which drives the solar tracker, following the sun, in order to ensure that solar panels are positioned for maximum energy production. One source that can be used is the power generated by a solar module. Typically, this solar module is specifically assigned only for generation of power to drive the motor. A single panel, even a relatively small panel, is often sufficient to drive the motor, which may only require about 15 W per day (generally between about 10 W and 25 W per day) to drive the solar tracker. In part this very small load is a testament to the balancing of the solar trackers themselves and the high precision engineering which has significantly reduced the mechanical load through balancing and reduction of friction within the system.

Despite the relatively low load of the system, there remain times when the energy produced by the dedicated solar cell is insufficient to drive the motor. This may occur when, for example, the systems are returning to a morning start position following the setting of the sun. Or it may occur when the sun is obscured by clouds and the solar panel is not generated sufficient power to drive the motor. In these types of instances, a battery is employed to drive the solar tracker. As will be appreciated, the ability to switch between the two power providing systems (i.e., the solar panel or the battery) is an important feature of any such system. Though there have been developed systems enabling this transition, there is always a need for improved and more efficient systems.

SUMMARY

The present disclosure is directed to a multi-power source system including a first power source, a second power source in a parallel with the first power source, and a diode preventing power from the second power source to drive the first power source, but permitting the first power source to charge the second power source. The system further includes a controller operably coupled to both the first and second power sources, and a plurality of field effect transistor (FETs) arranged in series with one or more of the first power source, the second power source, and the load, wherein controller can switch the plurality of FETs to enable the first power source to drive the load or the second power source to drive the load.

The first power source may be an array of solar panels, for example a solar tracker comprised of a plurality of solar panels. The load may be a drive motor for driving the solar tracker. The second power source may be a battery.

The system may further include a plurality of proportion, integral, derivative controllers to compare the output of the first and the second power sources. Further, the plurality of FETs may be two FETs which operate in opposing manners. In accordance with one aspect of the disclosure, the system further includes an inductor in series with the second power source, wherein the FETs are configured to charge the second power source by the first power source by controlling the direction of a current across the inductor to be a negative magnitude. Additionally or alternatively, the system further includes an inductor in series with the second power source, wherein the FETs are configured to cause the first power source to supply power to the load by controlling the direction of a current across the inductor to be a positive magnitude. Still further, the system includes an inductor in series with the second power source, wherein the second power source is electrically disconnected from the load by controlling the direction of a current across the inductor to be zero.

Additionally or alternatively, the system may further include a capacitor that is in parallel with the load motor. Further when the bus voltage is lower than a low voltage threshold, the plurality of FETs are modulated to charge the second power source by the first power source. Still further, when the bus voltage is higher than a high voltage threshold, the plurality of FETs are disabled. Further, when the bus voltage is between a high voltage threshold and a low voltage threshold, a charge status is checked on the second power source, in a case that the charge status indicates that the second power source is low then the plurality of FETs are modulated to charge the second power source by the first power source.

BRIEF DESCRIPTION OF THE DRAWINGS

Various aspects of the present disclosure are described herein below with reference to the drawings, which are incorporated in and constitute a part of this specification, wherein.

DETAILED DESCRIPTION

The present disclosure is directed to systems and methods for controlling a dual power system whereby a single load may be driven by two separate power sources, both individually and together. Though described generally herein in the context of a self-powered solar tracking apparatus that utilizes both a photovoltaic (solar) panel and a battery to provide energy to drive a motor that rotates the tracker assembly, the systems, schematics, and algorithms described herein in any situation where there is are two power sources. In particular the systems and algorithms of the present disclosure are useful where there is one power source that is the preferred power source to be utilized but the system should experience little to no lag in transitioning to the other power source. A further context for the present disclosure is in the area of a solar farm which is connected to a large power grid and may be associated with large battery banks that can be used to provide power to the grid when the solar panels are unable to meet demand. Commonly owned U.S. Pat. Pub. 2017/0288184 entitled "Standard energy storage container platform," filed Mar. 31, 2017 and teaches a battery container and U.S. patent application Ser. No. 15/872,071 entitled "Direct Current Battery String Aggregator for Standard Energy Storage Enclosure Platform," teaches a controller and system for connecting a battery and photovoltaic system to an energy grid. Both references are incorporated herein by reference. Other dual power source energy systems requiring monitoring and switching between energy supply systems are also contemplated within the scope of the present disclosure.

Figure 1:
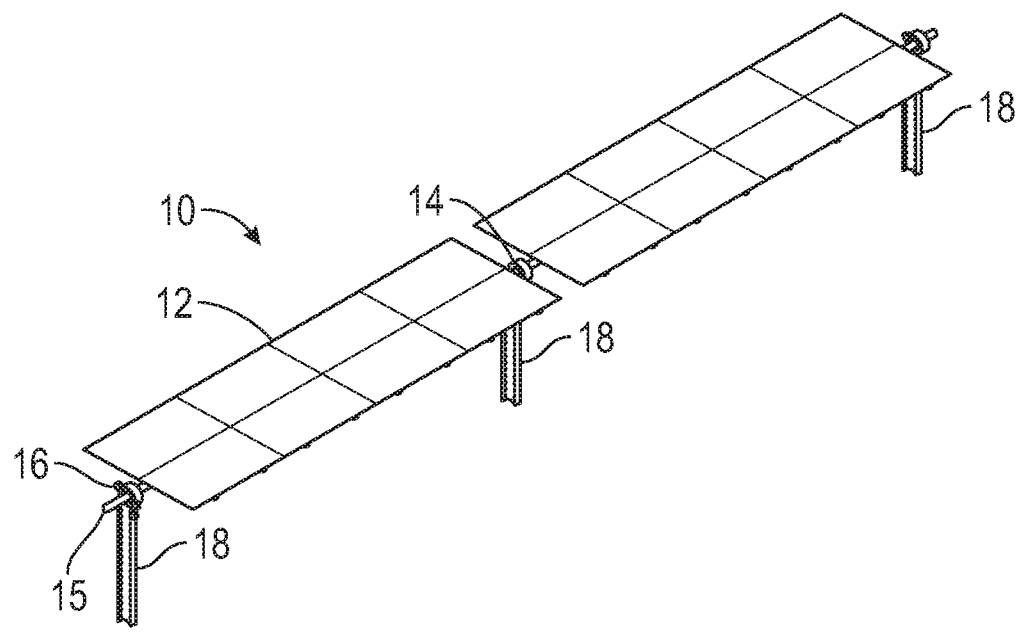
FIG. 1 depicts a self-powered solar tracker systems in accordance with the present disclosure.

FIG. 1 depicts a solar tracker system 10 which is commonly deployed as part of a larger array. Each tracker 10 includes a plurality of photovoltaic panels 12 (solar panels). A motor 14 drives a shaft 15, to which the solar panels 12 are affixed. By driving the shaft 14, the solar panels 12 are maintained at a proper angle to the sun to ensure maximum electrical power generation. The shaft 15 is suspended between the motor 14 and a swinging or rotating mount 16. Both the motor 14 and the rotating mounts 16 are supported on posts 18.

Figure 2:
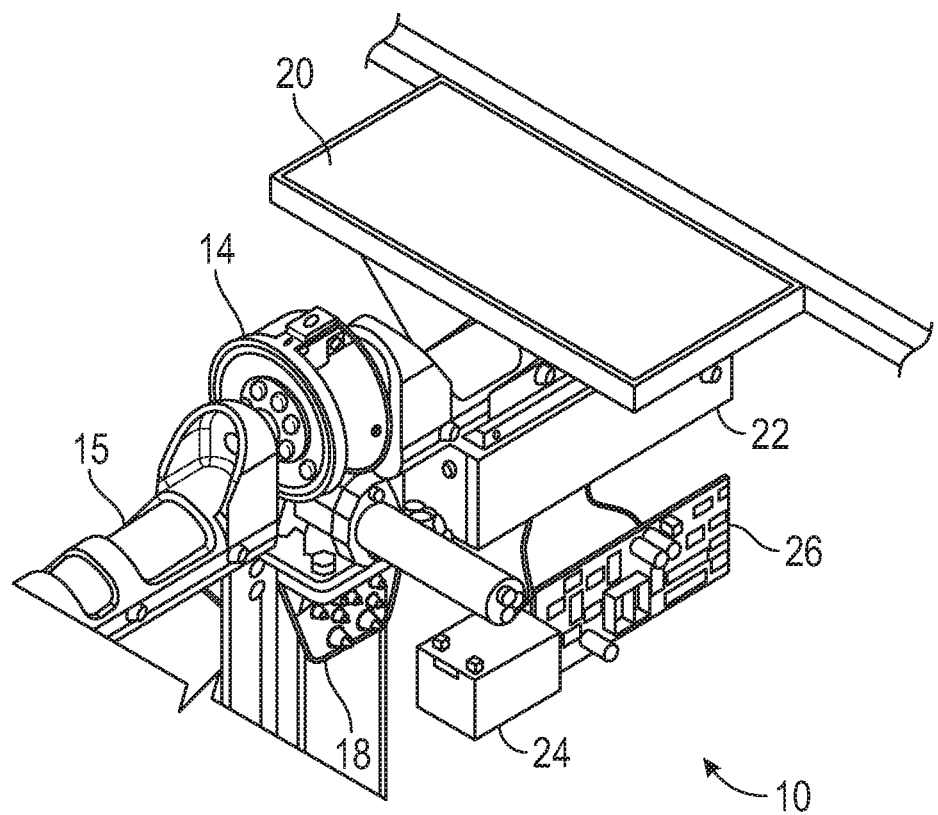
FIG. 2 depicts a detailed view of a drive mechanism of a self-powered solar tracker in accordance with the present disclosure.

FIG. 2 depicts the area of the tracker system 10 near the motor 14. As can be seen a dedicated drive solar panel 20 is located in proximity to the motor 14 and supported by the shaft 15. Either suspended from the underside of the shaft 15 or mounted to the post 18 is a box 22. The box 22 houses a battery 24, for example a lithium ion (Li-ion) battery, and a controller 26. The controller 26 provides input to the motor 14 regarding whether to drive and how far to drive the shaft 15 to enable the panels 12 to track the sun.

Figure 3:
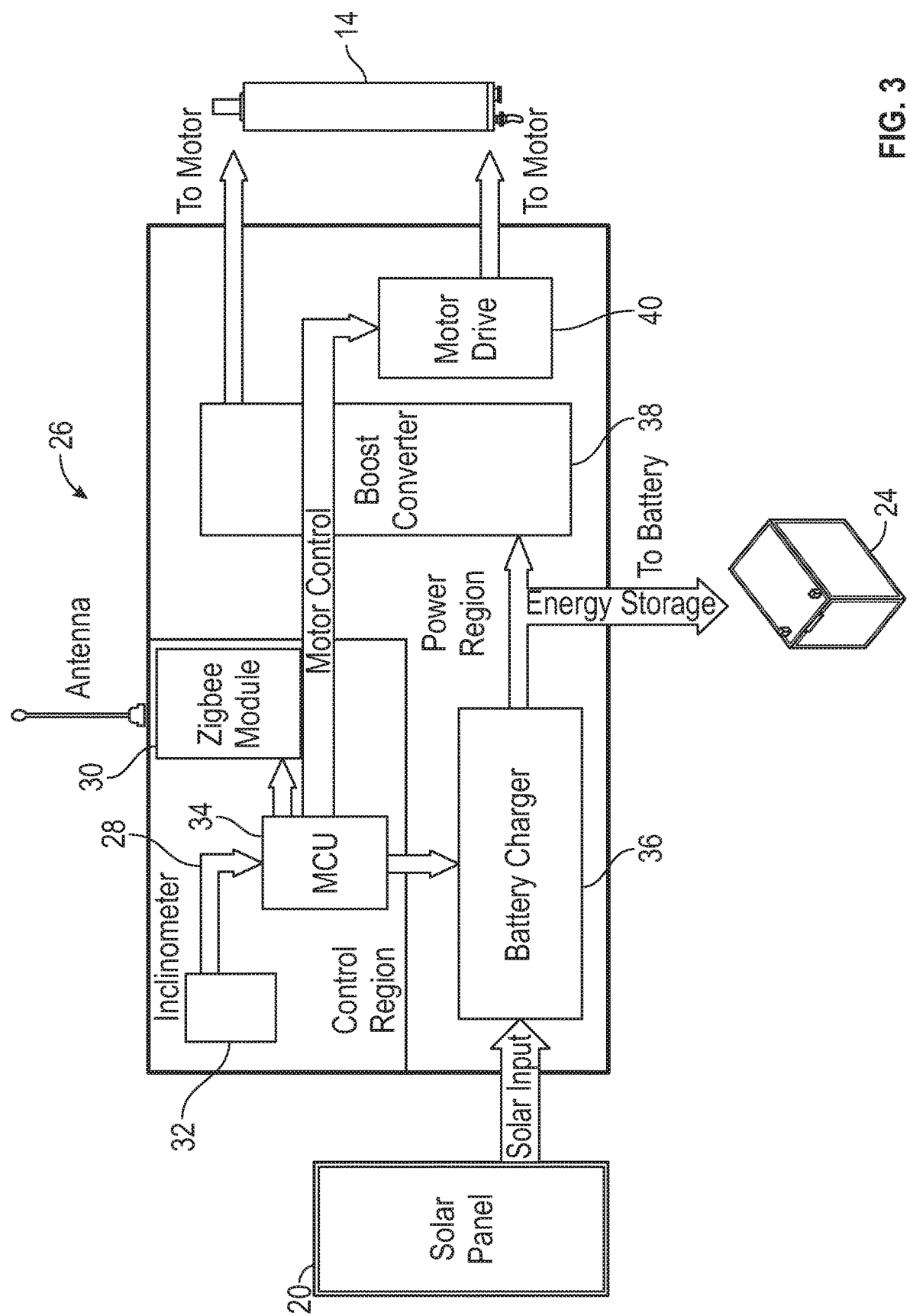
FIG. 3 depicts a schematic of a control system for a self-powered solar tracker in accordance with the present disclosure.

An example of the controller 26 can be seen in FIG. 3. The controller 26 includes a control region 28 which houses a communications module 30 (e.g., Zigbee, Wi-fi, Bluetooth®, etc.), an inclinometer 32, and a main controller (MCU) 34. The main controller 34 communicates with a battery charger 36 to control the charging of the batteries 24, and with a motor drive controller 40, which controls the driving of the motor 14. As depicted in FIG. 3, the solar panel 20 provides electricity to the battery charger 36, which at the discretion of the main controller 34 is either directed to the battery 24 for charging or to a boost converter 38 for application to the motor 14 to actually cause the motor 14 to be driven. The main controller 34 can also determine, based on the input from the solar panel 20, whether the energy being supplied is insufficient to drive the motor 14, and can cause the stored energy in the batter 24 to be utilized for this purpose.

Figure 4:
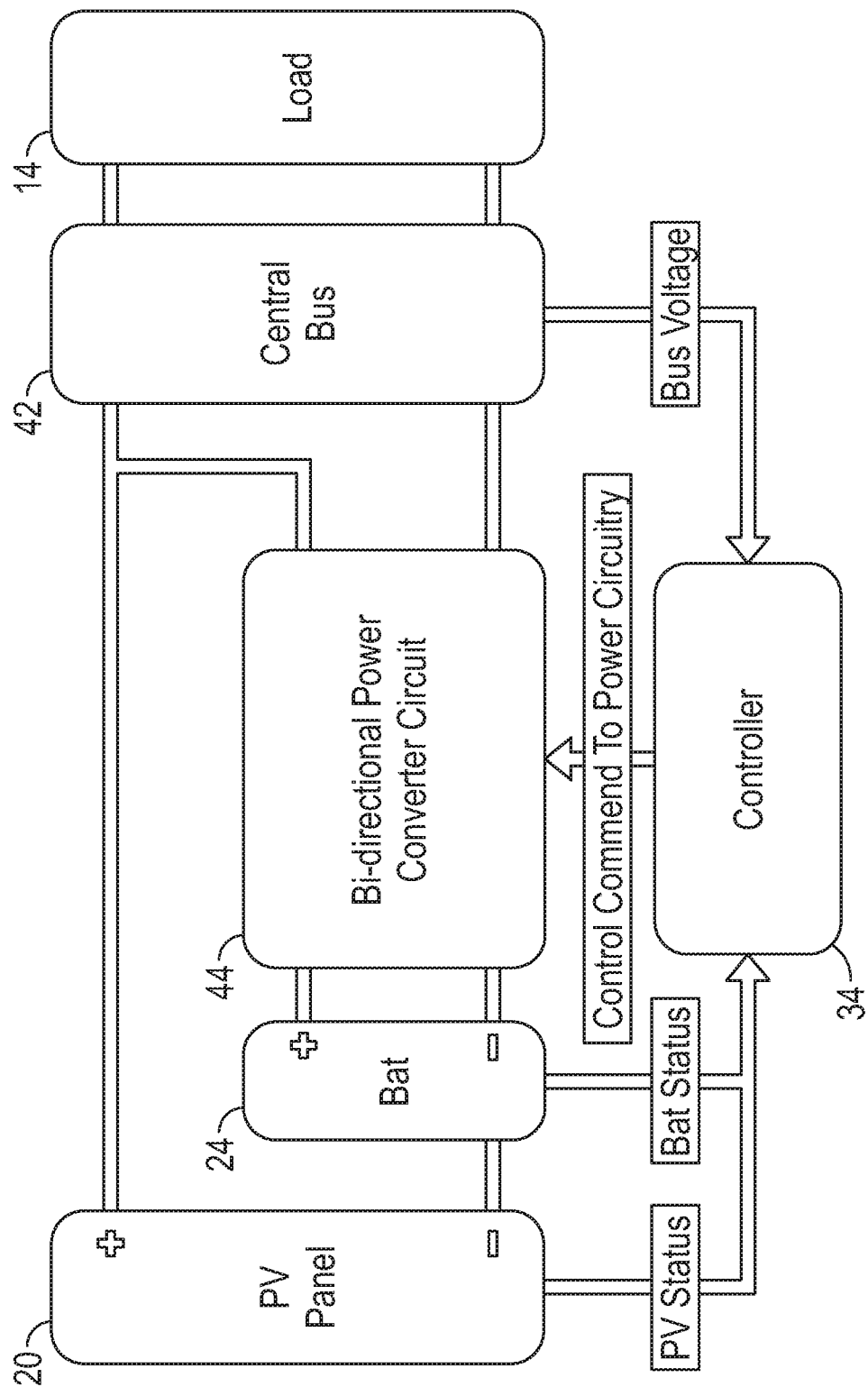
FIG. 4 depicts a schematic of a multi-source power systems in accordance with the present disclosure.

FIG. 4 is a high level schematic of dual source power supply in accordance with the present disclosure that may be used in place of or in conjunction with the components of FIG. 3. The solar panel 20 is in parallel with the battery 24 across a central bus 42. A load (e.g., motor 14) is also connected in parallel with the bus 42. A controller (e.g., main controller 34) receives inputs from each of the solar panel 20, the battery 24 and the bus 42. Based on these inputs the main controller 34 may determine whether to drive the motor 14 using the output of the solar panel 20, the output of the battery 24, and in what proportion to apply each. Still further, the controller may determine when to charge the battery 24. The goal is to be able to use either the solar panel 20 or the battery 24 without disrupting the driving of the motor 14. The signals from the main controller 34 are input to a bi-directional power converter 44 to achieve the desired output from the solar panel 20, battery 24, or both, or charging of the battery 24, as will be described in greater detail below.

Figure 5:
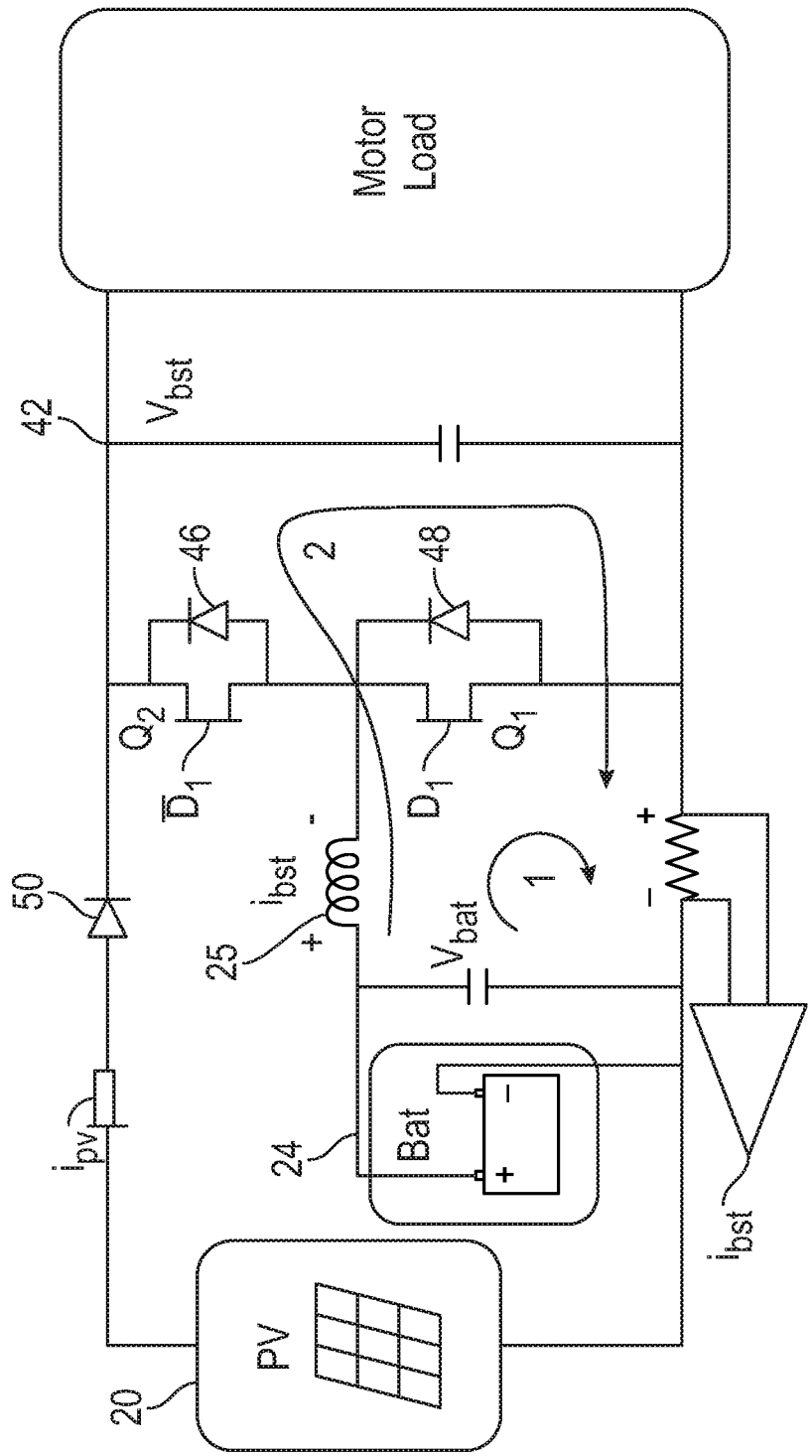
FIG. 5 depicts a hardware schematic of FIG. 4 including details of a bi-direction power control circuit in accordance with the present disclosure.

FIG. 5 is a hardware schematic of the system depicted in FIG. 4. The solar panels 20 provide an output to the central bus 42 (represented by the capacitor C1). A pair of field effect transistors (FET) 46 and 48 are utilized to selectively allow current to flow to and from the battery 24, or to prevent current flow from the battery 24. The solar panel 20 is always supplying whatever current it is generating to the central bus 42 and therewith the motor 14. The pair of FETs 46 and 48 open or close to regulate the voltage charging the battery 24, discharging the battery 24, or removing the battery 24 from the circuit, based on a determination by the main controller 34. The pair of FETs 46 and 48 are turned on or off, (e.g., pulsed) at a rate of, for example, 50 KHz to accomplish these three states.

When it is determined that the battery is sufficiently charged, and the solar panel 20 is providing sufficient power to drive the motor 14, the controller 34 will control the average duty cycle of the pair of FETs 46 and 48, which are pulsed, such that the solar panel 20 is predominately providing power to the motor 14 and providing limited charging of the battery 24, as appropriate to maintain full charge of the battery 24. In this way, charge and discharge cycling of the battery can be minimized and the life expectancy of the battery improved. Specifically, the battery 24 is not being constantly charged from the solar panel 20, and is only being discharged when it is determined that the solar panel 20 is not providing sufficient power (current) to drive the motor 14. If the battery 24 is charged and the solar panel is providing sufficient power then the battery 24 is essentially removed from the discharge circuit to prevent inadvertent draw down of its power.

Figure 6:
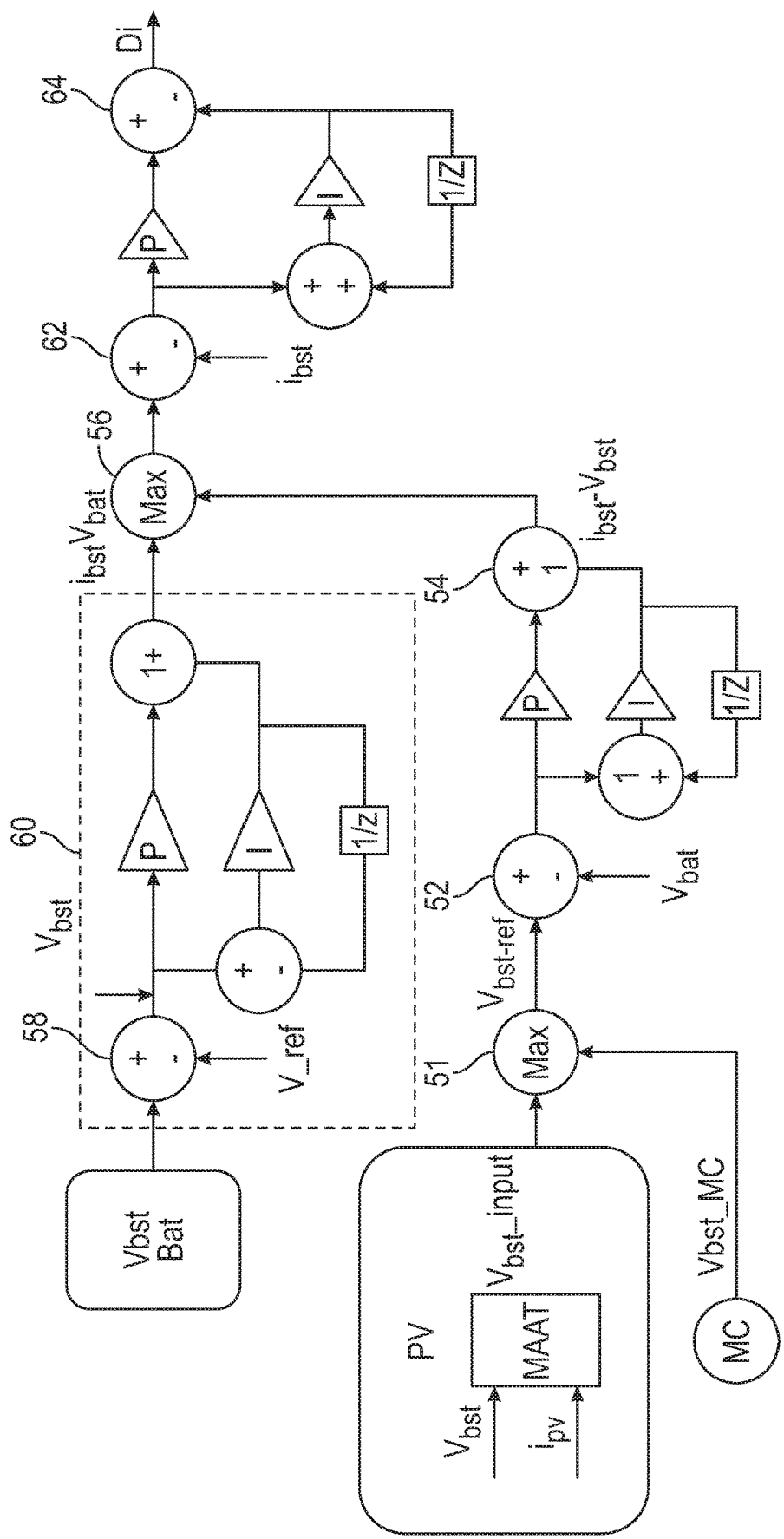
FIG. 6 depicts a control schematic associated with FIGS. 4 and 5 in accordance with the present disclosure.

FIG. 6 is a control schematic depicting the logic required to provide the input to the FETs 46 and 48 and control charge, discharge, and removal of the battery 24. In FIG. 6, the voltage output by the solar panel 20, for example determined using maximum power point tracking (MPPT) is compared to a reference voltage supplied by the main controller to determine which is greater in Min/Max 51. The output of that Min/Max 51 is then compared in comparator 52 to a reference voltage. The output of the comparator 52 is input to a PID (proportional, integral, derivative) controller 54. The output of the PID controller is then supplied to a Min/Max 56.

Simultaneously, with the solar panel 20 output determinations described above, a similar determination is made with respect to the battery 24. The battery 24 voltage is compared to a reference in comparator 58. The output of the comparator 58 is passed through a second PID controller 60. The output of the comparator 58 is also supplied to the Min/Max 56. Min/Max 56 compares the output of the PID controller 60 to the output of the PID controller 54, where the larger value is provided as an input to comparator 62. This value is then compared by comparator 62 to battery 24 current. Battery 24 current is measured at inductor 25. A positive current at the inductor 25 indicates that the battery 24 is discharging, and a negative current means that the battery 24 is charging. The result from comparator 62 value is fed into PID controller 64 to drive the pair of FETs 46 and 48 such that the battery 24 is charging, discharging, or removed from the circuit as appropriate to properly maintain the battery 24.

Figure 7:
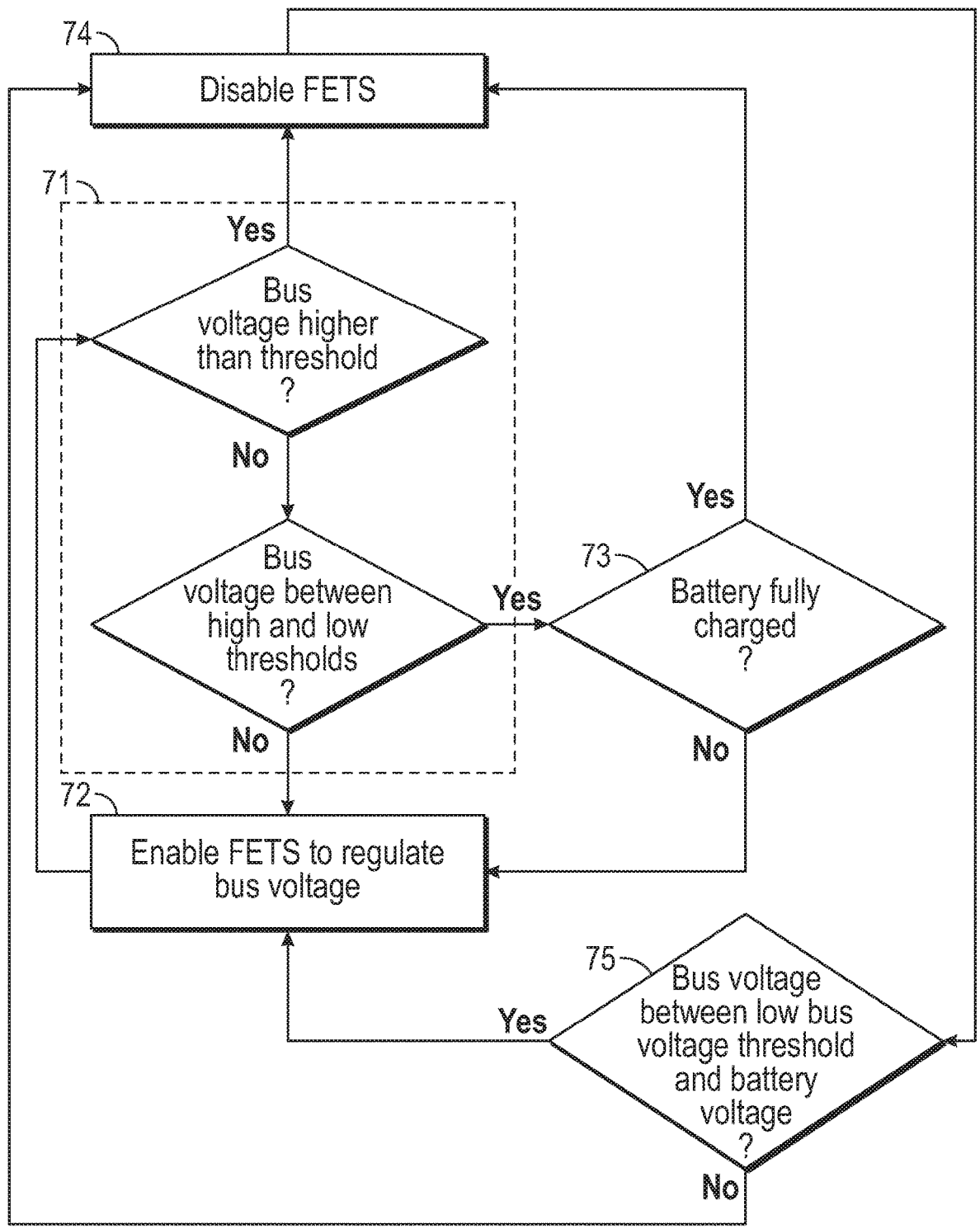
FIG. 7 depicts a logic flow for a control algorithm in accordance with the present disclosure.

Instead of monitoring the output of the solar panel 20 and the battery 24, a second algorithm, depicted in FIG. 7, can be employed to determine the status of FETs 46 and 48. As depicted in FIG. 7 the voltage of the bus 42 is monitored. With reference to FIG. 5, the bus 42 voltage is the voltage across capacitor C1.

In the outer loop of the diagram, the solar panel 20 and the battery 24 provide sufficient voltage across the bus 42 (C1). The bus 42 voltage is constantly monitored 71 by the controller 34. If the bus 42 voltage measures below a low voltage threshold voltage (for example, lower than the MPPT (maximum power point voltage) setting the bus 42 voltage is then regulated 72 by the pair of FETs 46 and 48. The first FET 46 and the second FET 48 are pulsed by the controller 34 to the MPPT voltage at, for example, a rate of 50 KHz. If the bus 42 voltage measures higher than the high voltage threshold, the pair of FETs 46 and 48 are disabled 74 and the controller 34 checks to see if the bus 42 voltage is between the low bus voltage and the battery 24 voltage 74. If the bus 42 voltage is not between the low bus voltage and the battery 24 voltage 74, then the pair of FETs 46 and 48 are disabled 74 and the controller 34 goes back to monitor mode 71. If the bus 42 voltage is between the low bus voltage threshold and the battery 24 voltage then the FETS are enabled to regulate 72 the bus 42 voltage. If the bus 42 voltage is in between the high voltage threshold and the low voltage threshold then the controller 34 checks to see if the battery 24 is fully charged 73. If the battery 24 is not fully charged, then the controller 34 enables the pair of FETs 46 and 48 to regulate the bus 42 voltage 72 at MPPT voltage. If the battery 24 is fully charged then the pair of FETs 46 and 48 are disabled 74 and the controller 34 goes back to monitor mode 71. In this fashion, the bus 42 voltage can be kept relatively constant. Which means the PV energy, battery energy, and load demand are in a balanced situation. Further, cycling of the battery 24 between charging and discharging can be minimized once the battery 24 is fully charged and the solar panels 20 are providing sufficient voltage across bus 42. This charging and discharging is controlled by changing the average duty cycle of the first FET 46 and second FET 48. Further, the battery 24 may be periodically checked both during charging and when not charging to ensure that it is ready and able to meet demand of the motor 14 when needed.

While several embodiments of the disclosure have been shown in the drawings, it is not intended that the disclosure be limited thereto, as it is intended that the disclosure be as broad in scope as the art will allow and that the specification be read likewise. Any combination of the above embodiments is also envisioned and is within the scope of the appended claims. Therefore, the above description should not be construed as limiting, but merely as exemplifications of particular embodiments. Those skilled in the art will envision other modifications within the scope of the claims appended hereto.

We claim:

1. A multi-power source system comprising:
   a first power source;
   a second power source in a parallel with the first power source;
   a diode preventing power from the second power source to drive the first power source, but permitting the first power source to charge the second power source;
   a controller operably coupled to both the first and second power sources; and
   a plurality of field effect transistor (FETs) arranged in series with one or more of the first power source, the second power source, and the load,
   wherein controller can switch the plurality of FETs to enable the first power source to drive the load or the second power source to drive the load,
   wherein when the bus voltage is between a high voltage threshold and a low voltage threshold, a charge status is checked on the second power source, and
   wherein when the charge status indicates that the second power source is low, the plurality of FETs are modulated to charge the second power source by the first power source.

2. The multi-power source system of claim 1, wherein the first power source is an array of solar panels.

3. The multi-power source system of claim 2, wherein the first power source is a solar tracker including a plurality of solar panels.

4. The multi-power source system of claim 3, wherein the load is a drive motor for driving a solar tracker.

5. The multi-power source system of claim 1, wherein the second power source is a battery.

6. The multi-power source system of claim 1, further comprising a plurality of proportion, integral, derivative controllers to compare the output of the first and the second power sources.

7. The multi-power source system of claim 1, wherein the plurality of FETs comprises two FETs which operate in opposing manners.

8. The multi-power source system of claim 7, further comprising an inductor in series with the second power source, wherein the FETs are configured to charge the second power source by the first power source by controlling the direction of a current across the inductor to be a negative magnitude.

9. The multi-power source system of claim 7, further comprising an inductor in series with the second power source, wherein the FETs are configured to cause the first power source to supply power to the load by controlling the direction of a current across the inductor to be a positive magnitude.

10. The multi-power source system of claim 7, further comprising an inductor in series with the second power source, wherein the second power source is electrically disconnected from the load by controlling the direction of a current across the inductor to be zero.

11. The multi-power source system of claim 7, further comprising a capacitor is in parallel with the load motor, wherein a bus voltage across the capacitor is monitored.

12. The multi-power source system of claim 11, wherein when the bus voltage is lower than a low voltage threshold, the plurality of FETs are modulated to charge the second power source by the first power source.

13. The multi-power source system of claim 11, wherein when the bus voltage is higher than a high voltage threshold, the plurality of FETs are disabled.

14. A method comprising:
   preventing power from a second power source to drive a first power source;
   permitting the first power source to charge the second power source;

switching a plurality of field effect transistor (FETs), which are in series with one or more of the first power source, the second power source, and a load, to enable the first power source to drive the load or the second power source to drive the load;

determining that the bus voltage is between a high voltage threshold and a low voltage threshold;

in response to determining that the bus voltage is between the high voltage threshold and the low voltage threshold, checking a charge status of the second power source; and if the charge status indicates that the second power source is low, modulating the plurality of FETs to charge the second power source by the first power source.

15. The method of claim 14, further comprising charging the second power source by the first power source by controlling the direction of a current across an inductor in series with the second power source to be a negative magnitude.

16. The method of claim 14, further comprising causing the first power source to supply power to the load by controlling the direction of a current across an inductor in series with the second power source to be a positive magnitude.

17. The method of claim 14, further comprising electrically disconnecting the second power source from the load by controlling the direction of a current across an inductor in series with the second power source to be zero.

18. The method of claim 14, further comprising monitoring a bus voltage across a capacitor in parallel with the load motor.

19. The method of claim 18, further comprising when the bus voltage is lower than a low voltage threshold, modulating the plurality of FETs to charge the second power source by the first power source.

20. The method of claim 18, further comprising when the bus voltage is higher than a high voltage threshold, disabling the plurality of FETs.

\* \* \* \* \*

UNITED STATES PATENT AND TRADEMARK OFFICE
CERTIFICATE OF CORRECTION

Page 1 of 1

PATENT NO. : 11,394,234 B2
APPLICATION NO. : 16/364959
DATED : July 19, 2022
INVENTOR(S) : Chen Li and Yang Liu It is certified that error appears in the above-identified patent and that said Letters Patent is hereby corrected as shown below:

On the Title Page

Add Priority Claim:
(30) Foreign Application Priority Data:
April 02, 2018    (CN)....................2018102828325

Signed and Sealed this
Fourth Day of March, 2025

Coke Morgan Stewart
*Acting Director of the United States Patent and Trademark Office*